United States Patent
Omi et al.

(10) Patent No.: US 6,427,747 B1
(45) Date of Patent: Aug. 6, 2002

(54) APPARATUS AND METHOD OF SEPARATING SAMPLE AND SUBSTRATE FABRICATION METHOD

(75) Inventors: Kazuaki Omi, Yokohama; Takao Yonehara, Atsugi; Kiyofumi Sakaguchi; Kazutaka Yanagita, both of Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/096,285

(22) Filed: Jun. 11, 1998

(30) Foreign Application Priority Data

Jun. 16, 1997 (JP) ............................................. 9-159038

(51) Int. Cl.⁷ ............................................. H01L 21/00
(52) U.S. Cl. ..................... 156/584; 156/344; 134/59; 134/137; 134/902; 15/418
(58) Field of Search ..................... 239/11, 698, 103, 239/231, 265.19, 165.33, 395, 397, 499, 504, 505, 507, 514, 515, 592, 596, 597, 598; 118/301; 15/414, 418; 156/344, 584; 134/59, 902, 137

(56) References Cited

U.S. PATENT DOCUMENTS 3,147,142 A * 9/1964 Rudo
3,583,634 A * 6/1971 Sheetz
3,664,586 A * 5/1972 Harris, Sr.
4,326,553 A * 4/1982 Hall
5,213,451 A * 5/1993 Frank et al.
5,232,155 A * 8/1993 Chen
5,255,853 A * 10/1993 Munoz
5,783,022 A * 7/1998 Cha et al. ................... 156/344
5,994,207 A * 11/1999 Henley et al.

FOREIGN PATENT DOCUMENTS

| AU | A-59662/98 | 10/1998 |
| FR | 2699852 A | 7/1994 |
| JP | 7-302889 A | 11/1995 |
| JP | 9-8095 | * 1/1997 |
| JP | 10-22238 | * 1/1998 |
| KR | 9723665 A | 5/1997 |

OTHER PUBLICATIONS

European Search Report dated Dec. 14, 1999.
Austrian Search Report mailed Sep. 2, 1999.
Patent Abstracts of Japan—JP 7–302889.
Australian Office Action mailed Sep. 3, 1999.

* cited by examiner

Primary Examiner—Curtis Mayes
(74) Attorney, Agent, or Firm—Morgan&Finnegan, LLP

(57) ABSTRACT

An apparatus for separating a substrate having a porous layer from the porous layer is provided. A bonded substrate stack having a porous layer is supported by substrate holders while being rotated. A jet nozzle ejects a high-speed, high-pressure liquid or water. The jet thrusts into the bonded substrate through a guide unit. The position in the x-axis direction of this guide unit is adjusted by a motor such that the jet is concentrated into the bonding interface of the bonded substrate stack.

12 Claims, 10 Drawing Sheets

APPARATUS AND METHOD OF SEPARATING SAMPLE AND SUBSTRATE FABRICATION METHOD

BACKGROUND OF THE INVENTION

1. Field of the Invention

The present invention relates to an apparatus and a method of separating a sample and a substrate fabrication method and, more particularly, to an apparatus and a method of separating a sample having an internal fragile structure and a substrate fabrication method using the separating apparatus.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric separation is easy.

(2) The radiation resistance can be increased.

(3) The operating speed of the device can be increased because the stray capacitance is small.

(4) No well step is necessary.

(5) Latch-up can be prevented.

(6) A completely depleted field-effect transistor can be formed by thin film formation.

Since an SOI structure has the above various advantages, researches have been made on its formation method for these several decades.

As one SOI technology, an SOS (Silicon On Sapphire) technology by which Si is heteroepitaxially grown on a single-crystal sapphire substrate by CVD (Chemical Vapor Deposition) has been known for a long time. This SOS technology was recognized temporarily as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

A SIMOX (Separation by ion IMplanted OXygen) technology appeared following the SOS technology. Various methods of this SIMOX technology have been attempted to, e.g., reduce the crystal defects and the fabrication cost. Examples are a method of forming a buried oxide layer by implanting oxygen ions into a substrate, and a method of bonding two wafers with an oxide film sandwiched between them and leaving a thin single-crystal Si layer behind on the oxide film by polishing or etching one of the wafers. Another example is a method in which hydrogen ions are implanted to a predetermined depth from the surface of an Si substrate on which an oxide film is formed, the resultant substrate is bonded to another substrate, and the other substrate is peeled by a heat treatment or the like such that a thin single-crystal Si layer is left behind on the oxide film.

A new SOI technology is disclosed in Japanese Patent Laid-Open No. 5-21338. In this technology, a first substrate obtained by forming a non-porous single-crystal layer on a single-crystal semiconductor substrate having a porous layer is bonded to a second substrate via an insulating layer ($SiO_2$), and the two substrates are separated from the porous layer to transfer the non-porous single-crystal layer to the second substrate. This technology is advantageous in that the SOI layer has high film thickness uniformity, the crystal defect density in the SOI layer can be decreased, the SOI layer has high surface flatness, no expensive special fabrication apparatus is necessary, and SOI substrates having SOI films about a few hundred Å to 10 µm thick can be fabricated by the same fabrication apparatus.

In addition, Another technology is disclosed in Japanese Patent Laid-Open No. 7-302889 in which, after the first and second substrates described above are bonded, the first substrate is separated from the second substrate without being broken, and the separated first substrate is reused by smoothening the surface and again forming a porous layer. Since the first substrate can be economically used, this technology has the advantages that the fabrication cost can be largely reduced and the fabrication process is also simple.

In the above technologies, however, when the two bonded substrates are separated it is necessary to prevent damages to the substrates and protect the fabrication apparatus and the like from contamination caused by the generation of particles.

SUMMARY OF THE INVENTION

The present invention has been made in consideration of the above situation and has as its object to provide an apparatus and a method suited to separate a sample such as a substrate, parts constituting the separating apparatus, and a substrate fabrication method using the separating apparatus.

A sample separating apparatus according to the present invention is a separating apparatus for separating a sample having an internal fragile structure, characterized by comprising a jet unit for ejecting a jet of liquid or gas, and a guide unit for concentrating the jet of liquid or gas ejected from the jet unit into the fragile structure of the sample, wherein the sample is separated from the fragile structure.

In the above separating apparatus, the guide unit preferably concentrates the jet of liquid or gas ejected from the jet unit into the fragile structure of the sample by decreasing a width of the jet to a predetermined width.

In the above separating apparatus, it is preferable that the guide unit have a hole for decreasing the width of the jet of liquid or gas ejected from the jet unit, and a width of an entrance of the hole be larger than the width of the jet of liquid or gas ejected from the jet unit.

In the above separating apparatus, it is preferable that the sample to be separated have a groove recessed toward an externally exposed portion of the fragile structure, and a width of an exit of the hole be smaller than a width of the groove.

In the above separating apparatus, the sample to be separated preferably has a groove recessed toward an externally exposed portion of the fragile structure.

In the above separating apparatus, the groove preferably has a substantially V-shaped section.

The above separating apparatus preferably further comprises an adjusting mechanism for adjusting a positional relationship between the guide unit and the sample.

In the above separating apparatus, the adjusting mechanism preferably adjusts the positional relationship between the guide unit and the sample by moving the guide unit.

It is preferable that the above separating apparatus further comprise an adjusting mechanism for adjusting a positional relationship between the guide unit and the sample, and the adjusting unit adjust the positional relationship between the guide unit and the sample to concentrate the jet of liquid or gas ejected through the guide unit into the groove.

In the above separating apparatus, the adjusting mechanism preferably adjusts the positional relationship between the guide unit and the sample by moving the guide unit.

The above separating apparatus preferably further comprises a support mechanism for supporting the sample.

In the above separating apparatus, it is preferable that the fragile structure of the sample to be separated form a substantially flat plane, and the support mechanism support the sample to send the jet of liquid or gas ejected through the guide unit in a direction of the plane of the fragile structure.

In the above separating apparatus, it is preferable that the support mechanism comprise a rotating mechanism for rotating the sample around a shaft disposed in a direction substantially perpendicular to the plane of the fragile structure, and support the sample while rotating the sample.

In the above separating apparatus, the guide unit is preferably disposed in a support unit for supporting the sample.

In the above separating apparatus, it is preferable that the support unit comprise two holding units for holding the sample by clamping the sample from both sides, and the guide unit be formed by a gap between opposing portions of the two holding units.

In the above separating apparatus, it is preferable that inclined surfaces be formed in the opposing portions of the two holding units, and the opposing inclined surfaces concentrate the jet of liquid or gas ejected from the jet unit into the fragile structure of the sample by decreasing the width of the jet to a predetermined width.

In the above separating apparatus, it is preferable that the sample to be separated have a disk-like shape, the opposing portions of the two holding units form annular rims, and the sample be held inside the rims.

In the above separating apparatus, the holding units preferably hold the sample to warp the sample by a pressure of liquid or gas.

In the above separating apparatus, the support mechanism preferably comprises a holding unit for holding substrate as a sample to be separated.

In the above separating apparatus, the two holding units are preferably holding units for holding a substrate as a sample to be separated.

In the above separating apparatus, the substrate preferably has a porous layer as a fragile structure.

A guide apparatus according to the present invention is a liquid or gas guide apparatus to be applied to a method of separating a sample having an internal fragile structure by ejecting a jet of liquid or gas, characterized by comprising a guide unit for concentrating the jet of liquid or gas ejected from a jet unit into the fragile structure of the sample.

In the above guide apparatus, the guide unit preferably concentrates the jet of liquid or gas ejected from the jet unit into the fragile structure of the sample by decreasing a width of the jet to a predetermined width.

In the above guide apparatus, it is preferable that the guide unit have a hole for decreasing the width of the jet of liquid or gas ejected from the jet unit, and a width of an entrance of the hole be larger than the width of the jet of liquid or gas ejected from the jet unit.

In the above guide apparatus, it is preferable that the sample to be separated have a groove recessed toward an externally exposed portion of the fragile structure, and a width of an exit of the hole be smaller than a width of the groove.

In the above guide apparatus, the sample to be separated preferably has a groove recessed toward an externally exposed portion of the fragile structure.

In the above inducting apparatus, the groove preferably has a substantially V-shaped section.

The above guide apparatus preferably further comprises a connecting unit for connecting with a sample separating apparatus comprising the jet unit and a holding mechanism for holding the sample, and an adjusting mechanism for adjusting a positional relationship between the guide unit and the sample.

A sample support apparatus according to the present invention is a sample support apparatus to be applied to a method of separating a sample having an internal fragile structure by ejecting a jet of liquid or gas, characterized by comprising two holding units for holding the sample by clamping the sample from both sides, wherein a guide unit for concentrating a jet of liquid or gas ejected from a jet unit into the fragile structure of the sample is formed by a gap between opposing portions of the two holding units.

In the above support apparatus, it is preferable that inclined surfaces be formed in the opposing portions of the two holding units, and the opposing inclined surfaces concentrate the jet of liquid or gas ejected from the jet unit into the fragile structure of the sample by decreasing he width of the jet to a predetermined width.

In the above support apparatus, it is preferable that the sample to be separated have a disk-like shape, the opposing portions of the two holding units form annular rims, and the sample be held inside the rims.

In the above support apparatus, the holding units preferably hold the sample to warp the sample by a pressure of liquid or gas.

In the above support apparatus, the sample to be separated preferably has a groove recessed toward an externally exposed portion of the fragile structure.

In the above support apparatus, the groove preferably has a substantially V-shaped section.

In the above support apparatus, a sample to be supported is preferably a substrate.

In the above support apparatus, the substrate preferably has a porous layer as a fragile structure.

A sample separating method according to the present invention is characterized by separating a sample from a fragile structure by using the separating apparatus described above.

In the above separating method, water is preferably used as a liquid to be ejected from the jet unit.

A substrate separating method according to the present invention is a separating method in which a substrate stack fabricated by bonding a non-porous layer of a first substrate, having one surface on which a porous layer and the non-porous layer are sequentially formed, to a second substrate is separated from the porous layer, characterized in that the separating apparatus described above is used in the separation.

A substrate fabrication method according to the present invention is a substrate fabrication method comprising the step of bonding a first substrate, having one surface on which a porous layer and the non-porous layer are sequentially formed, to a second substrate, and the step of separating the bonded substrate stack from the porous layer, characterized in that the separating apparatus described above is used in the separation step.

Another separating apparatus according to the present invention is a separating apparatus for separating a plate-like sample having an internal fragile structure, characterized by comprising a support mechanism for supporting the plate-like sample, and a jet unit for ejecting a jet of liquid or gas upon the fragile structure of the plate-like sample supported by the support mechanism, wherein the support mechanism supports the plate-like sample to warp a periphery of the plate-like sample by a pressure of the liquid or gas injected into the plate-like sample.

Further objects, features and advantages of the present invention will become apparent from the following detailed description of embodiments of the present invention with reference to the accompanying drawings.

DETAILED DESCRIPTION OF THE PREFERRED EMBODIMENT

A preferred embodiment of the present invention will be described below with reference to the accompanying drawings.

FIGS. 1A to 1E are views for explaining a method of fabricating an SOI substrate according to a preferred embodiment of the present invention in order of steps.

Figure 1A:
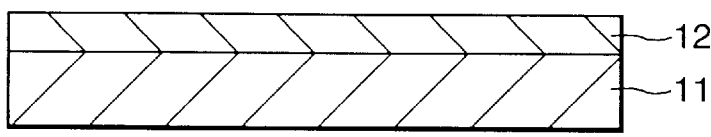
FIGS. 1A to 1E are views for explaining a method of fabricating an SOI substrate according to a preferred embodiment of the present invention in order of steps.

In the step shown in FIG. 1A, a single-crystal Si substrate 11 is prepared, and a porous Si layer 12 is formed on the surface of the single-crystal Si substrate 11 by, e.g., anodizing. Subsequently, in the step shown in FIG. 1B, a non-porous single-crystal Si layer 13 is formed on the porous Si layer 12 by epitaxial growth. Consequently, a first substrate 10 is formed.

Figure 1B:
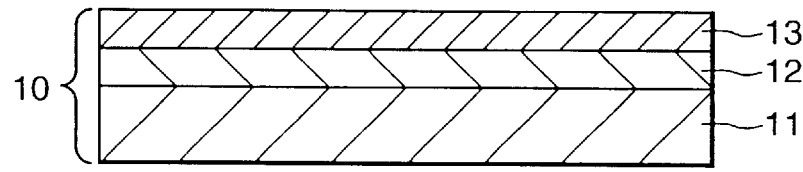
Figure 1C:
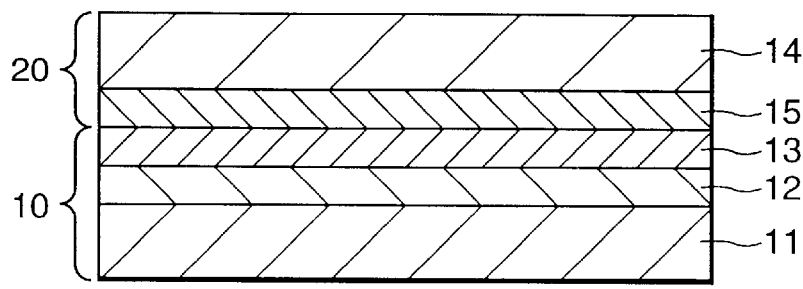

In the step shown in FIG. 1C, a second substrate 20 is prepared by forming an insulating layer (e.g., an $SiO_2$ layer) on the surface of a single-crystal Si layer 14. The first substrate 10 and the second substrate 20 are brought into contact at room temperature such that the non-porous single-crystal Si layer 13 and the insulating layer 15 oppose each other. Thereafter, the first and second substrates 10 and 20 are bonded by anodizing, pressing, heating, or a combination of these. By this process, the non-porous single-crystal Si layer 13 and the insulating layer 15 are tightly bonded.

Note that the insulating layer 15 can be formed on any of the single-crystal Si substrate 14 as described above, the non-porous single-crystal Si layer 13, and the both. That is, it is only necessary to obtain the state shown in FIG. 1C when the first and second substrates are brought into contact.

Figure 1D:
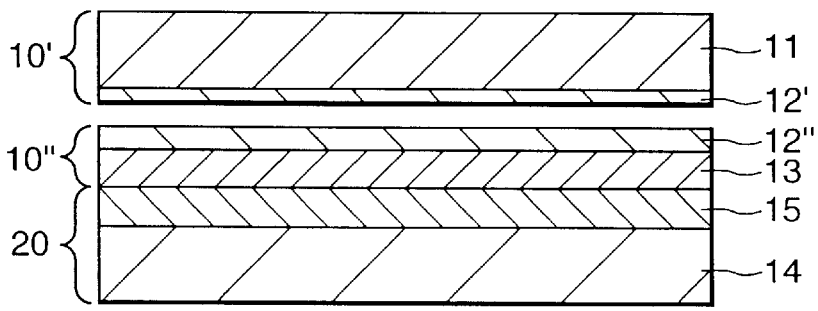

In the step shown in FIG. 1D, the two bonded substrates are separated from the porous Si layer 12. The resultant second substrate (10"+20) side has a stacked structure including porous Si layer 12"/single-crystal Si layer 13/insulating layer 15/single-crystal Si substrate 14. On the other hand, the first substrate (10') side has a porous layer 12' on the single-crystal Si substrate 11.

The first substrate (10') after the separation is reused as the single-crystal Si substrate 11 for forming the first substrate (10) by removing the residual porous Si layer 12' and planarizing the surface where necessary.

Figure 1E:
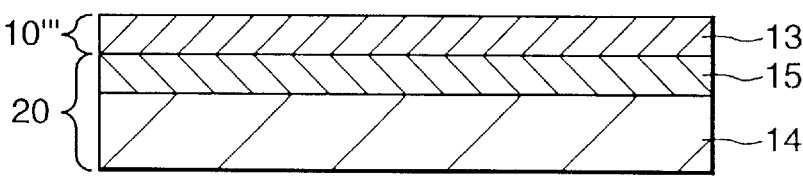

In the step shown in FIG. 1E after the bonded substrates are separated, the porous layer 12" on the surface of the second substrate (10"+20) is selectively removed. The result is a substrate having a stacked structure including single-crystal Si layer 13/insulating layer 15/single-crystal Si substrate 14, i.e., having an SOI structure.

In the step shown in FIG. 1D, i.e., in the step of separating the two bonded substrates (to be referred to as a bonded substrate stack hereinafter), this embodiment uses a separating apparatus for separating two substrates from a porous Si layer as a separation region by selectively ejecting a high-pressure liquid or gas upon the separation region.

[First arrangement of separating apparatus]

Figure 2:
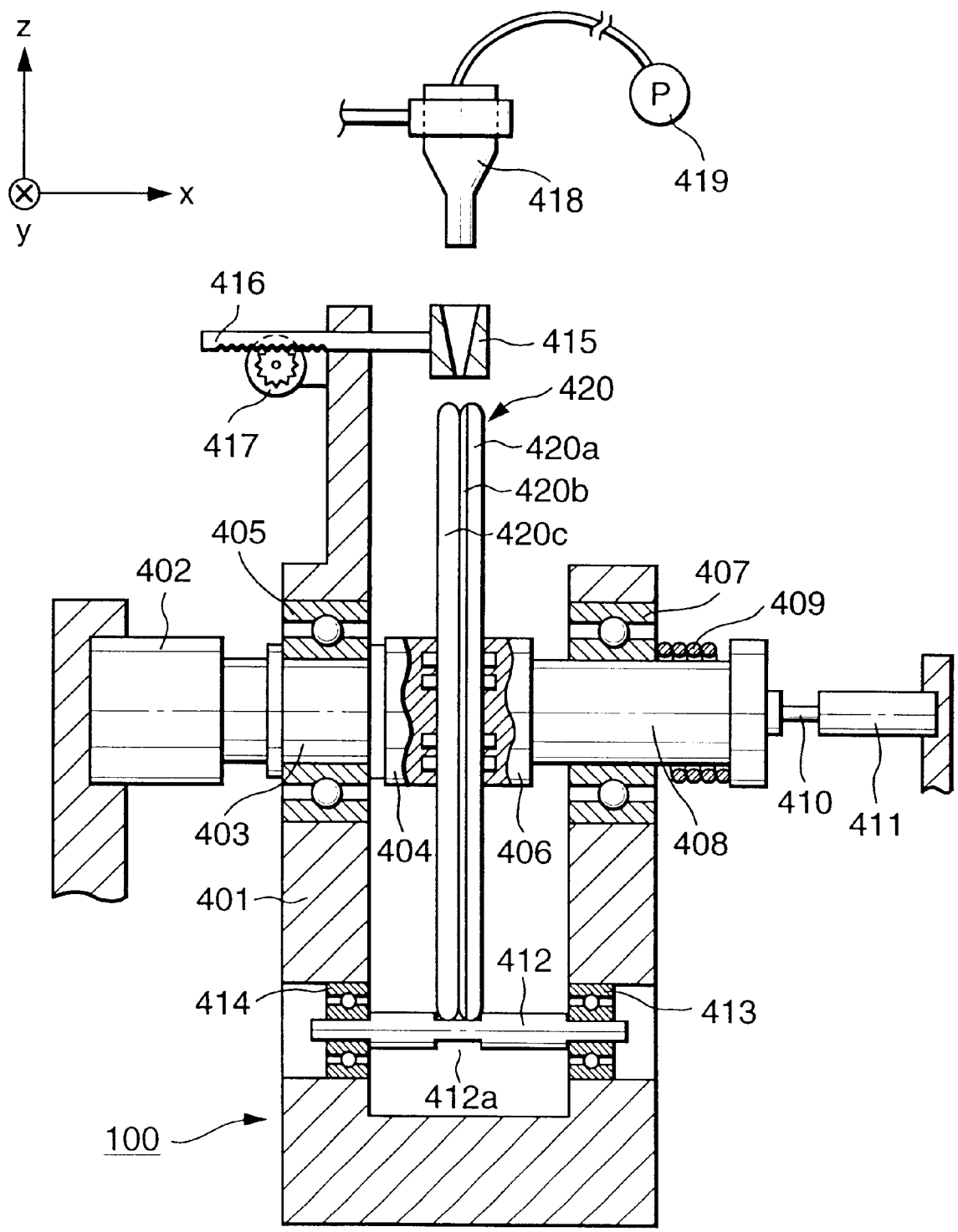
FIG. 2 is a sectional view showing an outline of the arrangement of a separating apparatus according to the preferred embodiment of the present invention.

FIG. 2 is a sectional view showing an outline of the arrangement of the separating apparatus according to the preferred embodiment of the present invention. This separating apparatus 100 uses a water jet method. Generally, the water jet method jets a high-speed, high-pressure stream of water upon an object to, e.g., perform processing, remove a coating film from the surface, or clean the surface ("Water Jet", Vol. 1, No. 1, page 4).

This separating apparatus 100 ejects a high-speed, high-pressure stream of liquid or gas upon a porous layer (separation region) of a bonded substrate stack in the direction of the plane of the substrate stack, thereby selectively breaking the porous layer and separating the substrate stack from the porous layer. In the following description, this stream will be referred to as a "jet", and a liquid or a gas forming the jet will be referred to as a "jet medium". As the jet medium, it is possible to use water, an organic solvent such as alcohol, acid such as fluoric acid or nitric acid, alkali such as potassium hydroxide, or a gas such as air, nitrogen gas, carbonic acid gas, rare gas, or an etching gas.

The separating apparatus 100 has substrate holders 404 and 406 including vacuum chucks. These substrate holders 404 and 406 hold a bonded substrate stack 420 by clamping the bonded substrate stack 420 from both sides. The bonded substrate stack 420 has a porous layer 420b as an internal fragile structure. The separating apparatus 100 separates the bonded substrate stack 420 into two substrates 420a and 420c from the porous layer 420b. In this separating apparatus 100, the bonded substrate stack 420 is so set that the substrate 420a corresponds to the first substrate (10') in FIG. 1 and the substrate 420c corresponds to the second substrate (10"+20) in FIG. 1.

The substrate holder 404 is connected to one end of a rotary shaft 403 rotatably axially supported by a support base 401 via a bearing 405. The other end of the rotary shaft 403 is connected to the rotary shaft of a motor 402. Accordingly, the bonded substrate stack 420 held by vacuum suction by the substrate holder 404 is rotated by the rotational force generated by the motor 402. In separating the bonded substrate stack 420, the motor 420 rotates the rotary shaft 403 at a designated rotational speed in accordance with an instruction from a controller (not shown).

The substrate holder 406 is connected to one end of a rotary shaft 408 rotatably axially supported by the support base 401 via a bearing 407. A compression spring 409 is attached to the other end of the rotary shaft 408. Therefore, the compression spring 409 biases the bonded substrate stack 420 in a direction (x-axis direction) in which the substrates 420a and 420c are separated from each other. Consequently, when the bonded substrate stack 420 is separated into the substrates 420a and 420c by the jet from a jet nozzle 418, the substrate 420a moves away from the substrate 420c in the x-axis direction.

When the bonded substrate stack 420 is left unseparated, the rotational force of the rotary shaft 403 is transmitted to the substrate holder 406 via the bonded substrate stack 420. As a consequence, the rotary shaft 403, the substrate holder 404, the bonded substrate stack 420, the substrate holder 406, the rotary shaft 408, and the compression spring 409 integrally rotate. When the bonded substrate stack 420 is separated into the two substrates, the rotation of the rotary shaft 408 stops.

An air cylinder 411 is connected to the rear end (in the x-axis direction) of the rotary shaft 408. When the bonded substrate stack 420 is held by the substrate holders 404 and 406, a piston rod 410 of this air cylinder 411 pushes the rear end of the rotary shaft 408 in a direction (negative direction of the x axis) in which the compression spring 409 is compressed (the state shown in FIG. 2). After the substrate holders 404 and 406 hold the bonded substrate stack 420 by the vacuum chucks, the air cylinder 411 accommodates (moves) the piston rod 410 (in the x-axis direction) to allow the process of separating the bonded substrate stack 420. That is, the air cylinder 411 pushes the piston rod 410 when the bonded substrate stack 420 is set between the substrate holders 404 and 406 and accommodates the piston rod 410 when the setting is complete.

To set the bonded substrate stack 420 in this separating apparatus 100, the bonded substrate stack 420 is placed in a groove 412a of a positioning shaft 412 axially supported by the support base 401 so as to be rotatable by bearings 413 and 414. After that, the piston rod 410 is pushed as described above to abut the substrate holder 406 against the bonded substrate stack 420. In this state (shown in FIG. 2), the vacuum chucks of the substrate holders 404 and 406 are operated.

It is preferable to dispose two positioning shafts 412 in a y-axis direction. If this is the case, the position of the bonded substrate stack 420 in three directions of x, y, and z can be defined only by placing the bonded substrate stack 420 on the two positioning shafts 412. This facilitates manually setting the bonded substrate stack 420. Additionally, if a conveyor robot is used the arrangement of this conveyor robot can be simplified.

To remove the separated substrates, after the substrate 420a moves in the x-axis direction upon completion of the separation and the two substrates move away from each other, these two substrates are held by, e.g., conveyor robots. Then, the suction by the vacuum chucks of the substrate holders 404 and 406 is released.

After the bonded substrate stack 420 is set, a controller (not shown) positions a guide unit 415 so that the discharge opening of the guide unit 415 is positioned above the bonding interface of the bonded substrate stack 420. The guide unit 415 is connected to a support rod 416 loosely inserted into the support base 401 so as to be movable in the x-axis direction. The position of the guide unit 415 is finely adjusted by a motor 417.

In the process of separating the bonded substrates 420, a pump 419 compresses and supplies a jet medium (e.g., water) to the jet nozzle 418, and the jet nozzle 418 ejects a high-speed, high-pressure jet toward the injection opening of the guide unit 415.

Since the discharge opening of the guide unit 415 is positioned above the bonding interface of the bonded substrate stack 420, the jet discharged from the discharge opening of the guide unit 415 concentratedly thrusts into the bonding interface of the bonded substrate stack 420.

Figure 3:
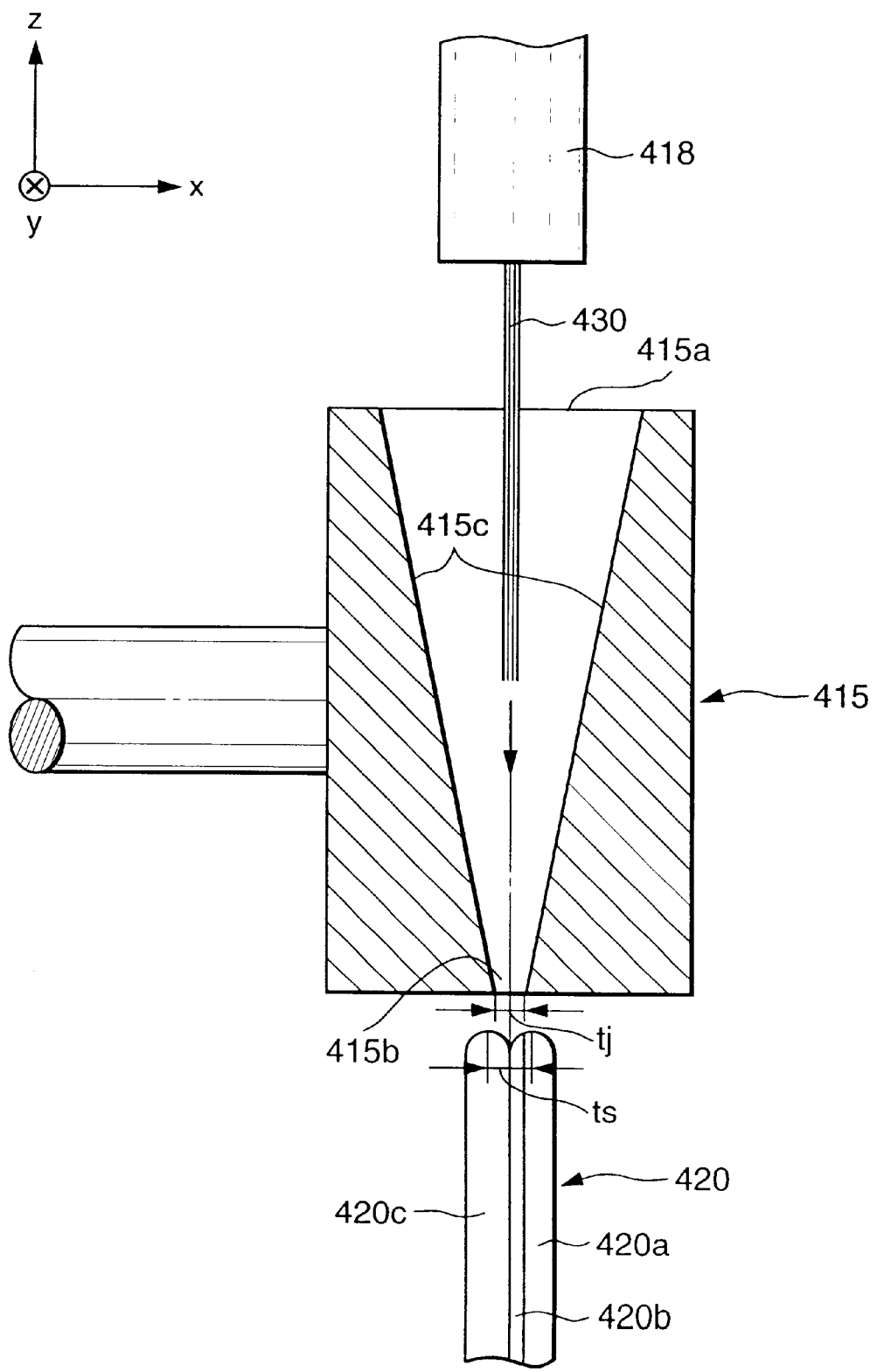
FIGS. 3 to 5 are enlarged views showing a guide unit, a jet nozzle, and a bonded substrate stack.
Figure 4:
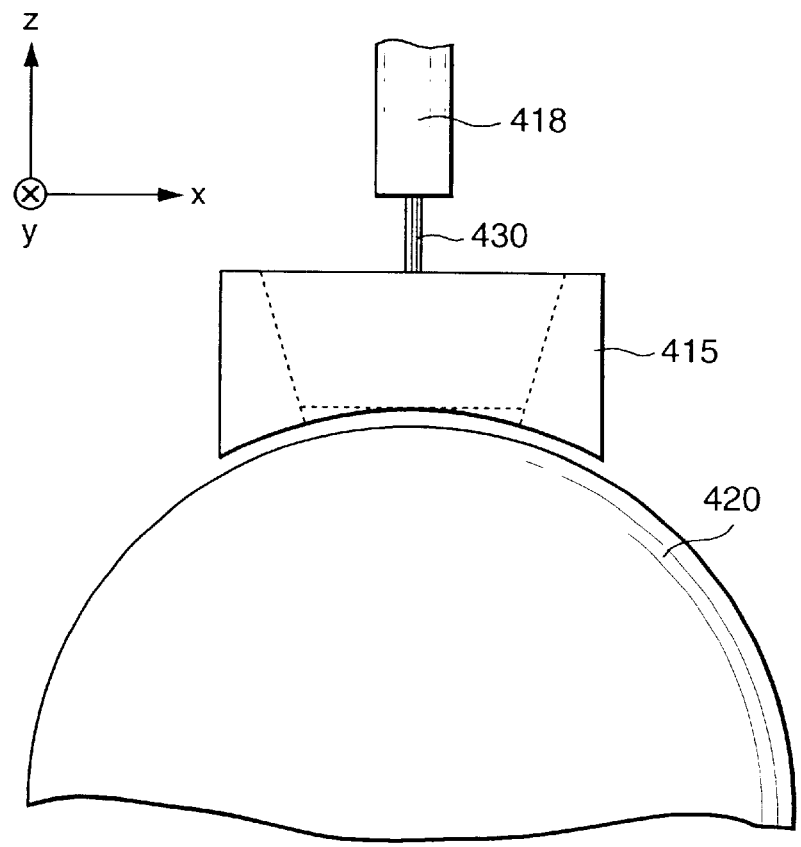
Figure 5:
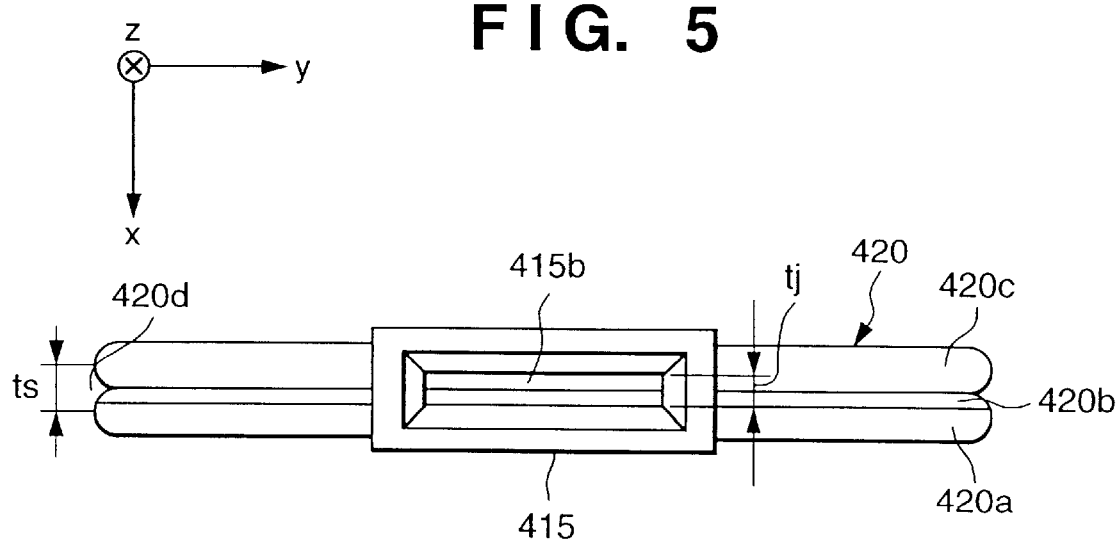
Figure 6:
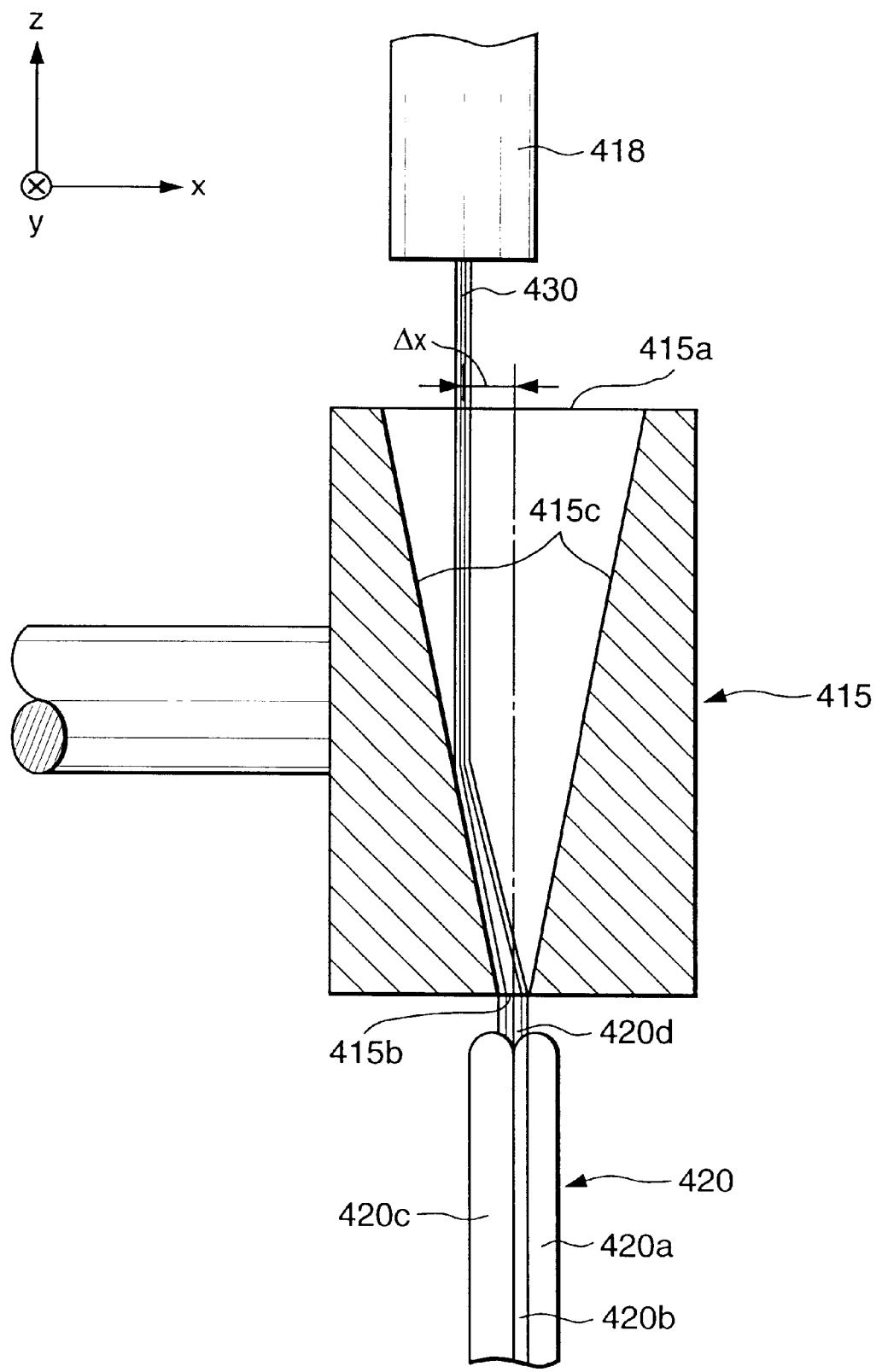
FIG. 6 is a view showing the state in which the bonding interface deviates from the center of the jet nozzle.

FIGS. 3 to 5 are enlarged views of the guide unit, the jet nozzle, and the bonded substrate stack. The guide unit 415 has a hole 415c gradually tapered narrower from an injection opening 415a to a discharge opening 415b. This hole 415c corrects the position at which a jet 430 ejected from the jet nozzle 418 thrusts into the bonded substrate stack 420. FIG. 6 is a view showing the state in which the bonding interface and the center of the jet nozzle 418 deviate from each other. Even in the state shown in FIG. 6, the jet 430 sprayed from the jet nozzle 418 collides against the wall surface of the hole 415c, and this corrects the direction of the jet 430. The jet 430 in this corrected state is discharged from the discharge opening 415b. That is, since this guide unit 415 is used, it is only necessary to control the jet nozzle 418 to be positioned above the injection opening 415a of the guide unit 415. Note that the kinetic energy of the jet is decreased by the collision against the wall surface of the hole 415c, so it is necessary to control the pump 419 by taking this decrease into consideration.

The bonded substrate stack 420 desirably has a V-groove 420d recessed toward the bonding interface in the circumferential surface of the substrate stack. This V-groove 420d can be easily formed by using chamfered substrates as a single-crystal Si substrate constituting the first substrate (10 in FIG. 1) and as a single-crystal Si substrate constituting the second substrate (20 in FIG. 1).

The V-groove 420d allows the jet 430 to efficiently thrust into the bonded substrate stack 420.

Figure 13A:
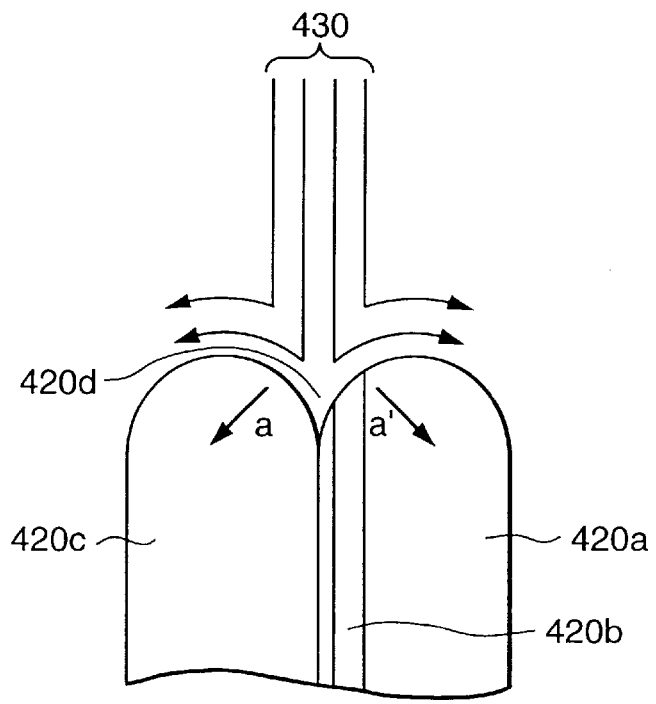
FIGS. 13A and 13B are views schematically showing the difference between the force acting on a bonded substrate stack having a V-groove and the force acting on a bonded substrate stack having no V-groove.
Figure 13B:
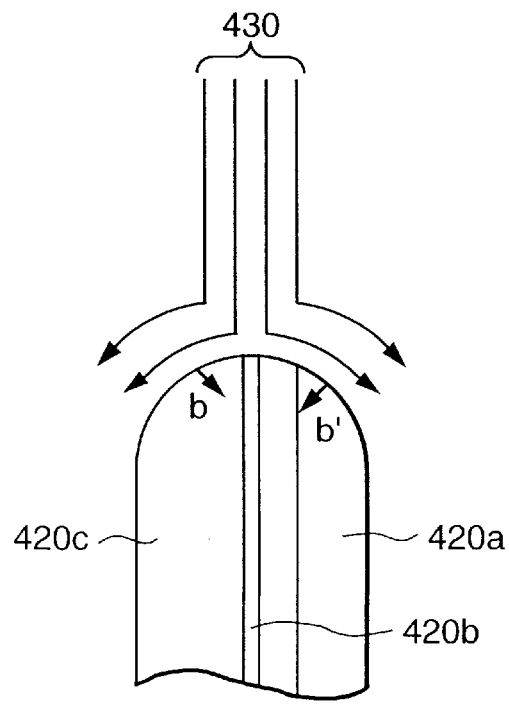

FIGS. 13A and 13B are views schematically showing the difference between the force acting on a bonded substrate stack having the V-groove and the force acting on a bonded substrate stack having no V-groove. FIG. 13A shows a bonded substrate stack having a V-groove 420d, and FIG. 13B shows a bonded substrate stack having no V-groove. When the V-groove 420d is formed, the force of the jet acts in directions in which the bonded substrate stack 420 is separated as indicated by arrows a and a'. When no V-groove is formed, the force acts in directions in which the bonded substrate stack 420 is compressed inward from both sides as indicated by arrows b and b'. If this is the case, the force does not easily act in the directions in which the bonded substrate stack 420 is separated until the circumferential surface (exposed portion) of the porous layer 420b breaks and a V- or U-groove forms in this broken portion. Therefore, the bonded substrate is separated more easily when the V-groove is formed.

The V-groove 420d also effectively functions when the circumferential surface of the bonded substrate stack is covered with a thin film. That is, since the V-groove allows the force to act in the directions in which the bonded substrate stack is separated, the thin film efficiently breaks in the presence of this force.

The jet thrust into the bonded substrate stack 420 selectively breaks the porous layer 420b as a separation region for separating the bonded substrate stack 420 and gives almost no damages to other portions. This is so because the porous layer 420b (the porous layer 12 in FIG. 1C) has an extraordinarily fragile structure compared to the single-crystal Si substrate (the surface of the substrate 420a, and the single-crystal Si substrate 11 in FIG. 1C) and the insulating layer (the surface of the substrate 420c, and 10 the insulating layer 13 in FIG. 1C) in contact with the porous layer 420b.

The shape of the injection opening 415a can be a rectangle as shown in FIGS. 3 to 5 and can also have some other shape. That is, the injection opening 415a need only have a shape with which the jet ejected from the jet nozzle 418 can be introduced into the hole 415c.

The shape of the discharge opening 415b is desirably a narrow rectangle extending in the direction (y-axis direction) of the plane of the bonded substrate stack 420, because the separation region is linear. Also, a width tj of the discharge opening 415b along the axial direction (x-axis direction) of the bonded substrate stack 420 is desirably smaller than a width ts of the V-groove 420d formed in the circumference of the bonded substrate stack 420. This is so because the jet can be narrowed and concentrated into the V-groove 420d (FIG. 13A) and therefore can be efficiently used.

Additionally, the motor 417 is desirably so controlled that the center of the discharge opening 415b in the axial direction (x-axis direction) of the bonded substrate stack 420 is roughly aligned with the center of the separation region, i.e., the porous layer 420b of the bonded substrate stack 420. Consequently, the jet discharged from the discharge opening 415b can be efficiently used.

Furthermore, as shown in FIG. 4, that surface of the guide unit 415 which faces the bonded substrate stack 420 desirably has a shape corresponding to the arc of the bonded substrate stack 420. This allows the jet discharged from the discharge opening 415b to be efficiently used.

Figure 7:
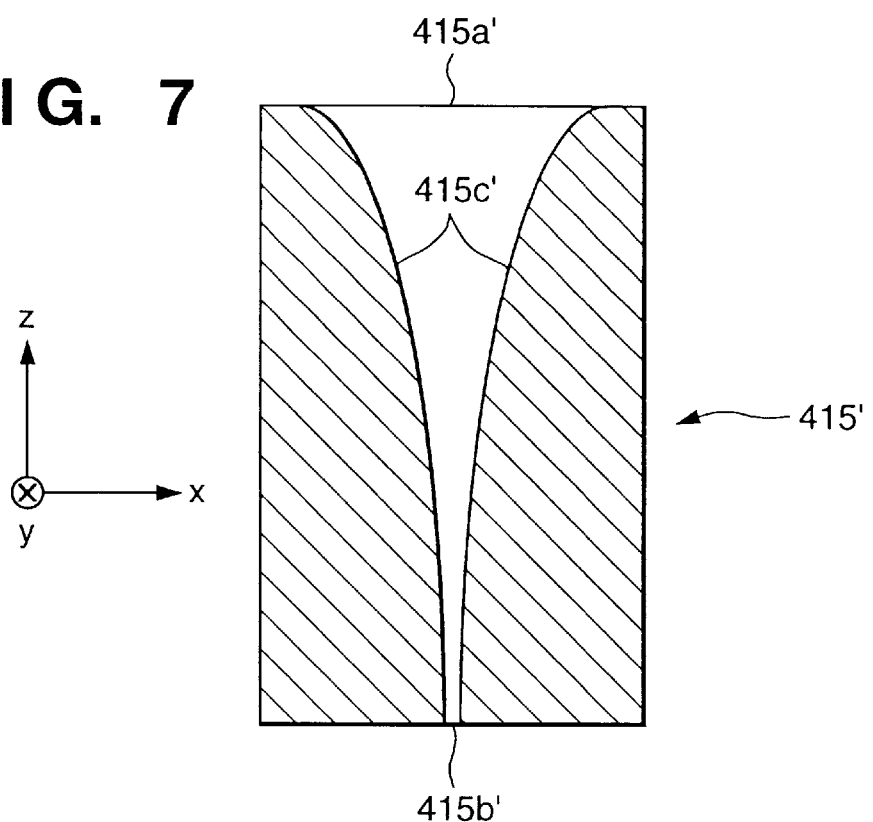
FIG. 7 is a view showing another sectional shape of the guide unit.
Figure 8:
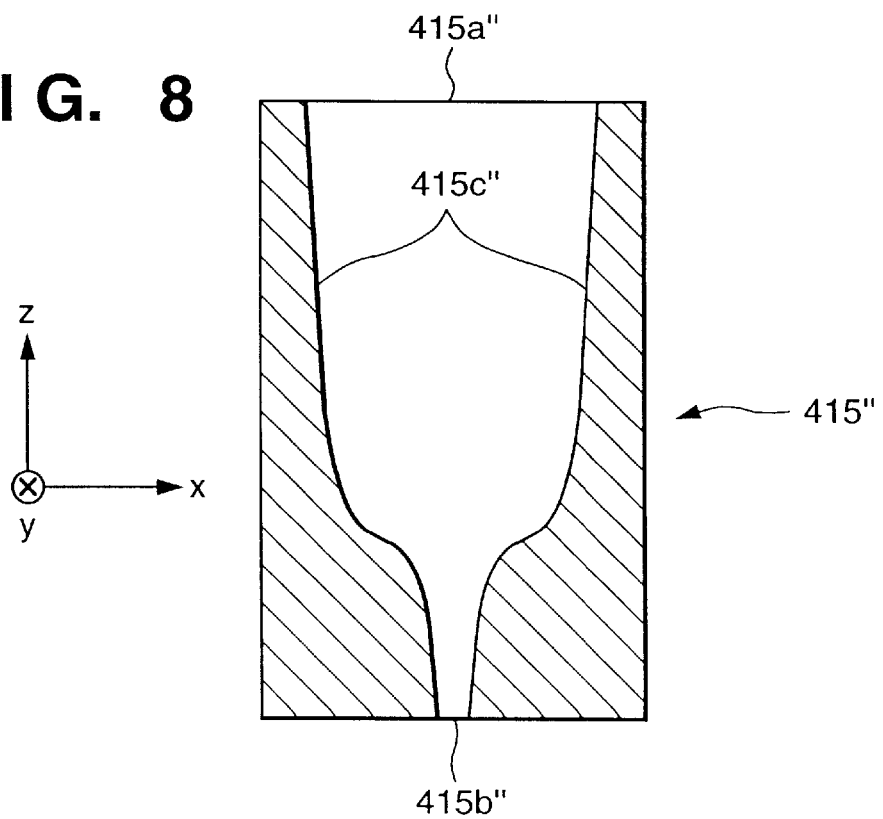
FIG. 8 is a view showing still another sectional shape of the guide unit.

The sectional shape of the hole of the guide unit 415 is not limited to a wedge shape, such as the hole 415c described above, obtained by cutting a hole through a component of the guide unit 415. FIGS. 7 and 8 are views showing other examples of the sectional shape of the guide unit.

This separating apparatus 100 has the following advantages because the apparatus separates a bonded substrate stack by using a jet.

(1) Since a liquid or gas (jet medium) is used to separate substrates, the separated surfaces of the substrates are damaged little.

(2) No large amount of particles are generated or scattered.

(3) The force acting in a direction perpendicular to the separated surfaces has high in-plane uniformity.

(4) The separating process can be rapidly performed.

(5) A bonded substrate stack having a large area can be easily separated because the jet medium (e.g., water) easily enters into the narrow gap formed between the opposing separated surfaces by the separating process.

(6) A large number of substrate stacks can be easily, simultaneously processed.

(7) Various bonded substrate stacks can be readily processed because the degree of freedom of control (e.g., the pressure and the diameter) of the jet is large.

(8) Since no heat treatment or the like is necessary, the process can be performed in a normal environment (e.g., normal temperature and normal pressure).

Note that when the jet separating method is used, an arrangement (to be referred to as a direct-type arrangement hereinafter) in which a jet ejected from a jet nozzle directly thrusts into a bonded substrate stack is also effective. The present invention does not exclude this arrangement. However, this separating apparatus 100 includes the guide unit 415 for adjusting the position at which the jet ejected from the jet nozzle 418 thrusts into the bonded substrate stack. Therefore, the apparatus is superior to a direct-type separating apparatus in the following aspects.

(9) A low-accuracy driving mechanism can be used as a driving mechanism for adjusting the position of a jet nozzle or as a driving mechanism for adjusting the position of a substrate holder. Consequently, it is possible to simplify the overall arrangement of the separating apparatus and reduce the cost of the separating apparatus.

More specifically, in the jet separating method it is necessary to accurately set the position at which a jet ejected from a jet nozzle thrusts into a bonded substrate stack. For example, when a general-purpose water jet apparatus is remodeled and used, the diameter of the jet is usually 0.1 to 0.3 mm which is small enough to separate a bonded substrate stack. Therefore, satisfactory positioning accuracy can be obtained by increasing the accuracy of a driving mechanism of the jet nozzle or a driving mechanism of a bonded substrate stack holder. However, when a high-accuracy driving mechanism is used as the driving mechanism of the jet nozzle or the substrate holder, the arrangement of the separating apparatus is complicated, and the apparatus becomes expensive. In this separating apparatus 100, on the other hand, the simple and compact guide unit 415 aligns the jet and the bonded substrate stack. Accordingly, it is unnecessary to use a high-accuracy driving mechanism as the driving mechanism of the jet nozzle or the driving mechanism of the bonded substrate stack holder.

(10) The separating process can be performed more rapidly than when a direct-type separating apparatus is used.

More specifically, when a separating apparatus uses a general jet nozzle, it is possible to increase the flow rate of the jet as a means for increasing the speed of the separating process. To increase the flow rate of the jet, a method of increasing the diameter of the jet or a method of increasing the speed of the jet are possible. In the former method, however, if the diameter of the jet exceeds the width of the V-groove of the bonded substrate stack, almost no effect of increasing the flow rate can be obtained. In addition, a problem such as vibrations of the bonded substrate stack can occur. In the latter method, the pressure of the jet increases as the jet speed increases. This increases the possibility of the bonded substrate stack being damaged.

On the other hand, the separating apparatus 100 of the present invention can readily increase the flow rate of the jet while limiting the width of the jet in the axial direction of the bonded substrate stack. Therefore, the speed of the bonded substrate separating process can be easily increased.

[Second arrangement of separating apparatus]

Figure 9:
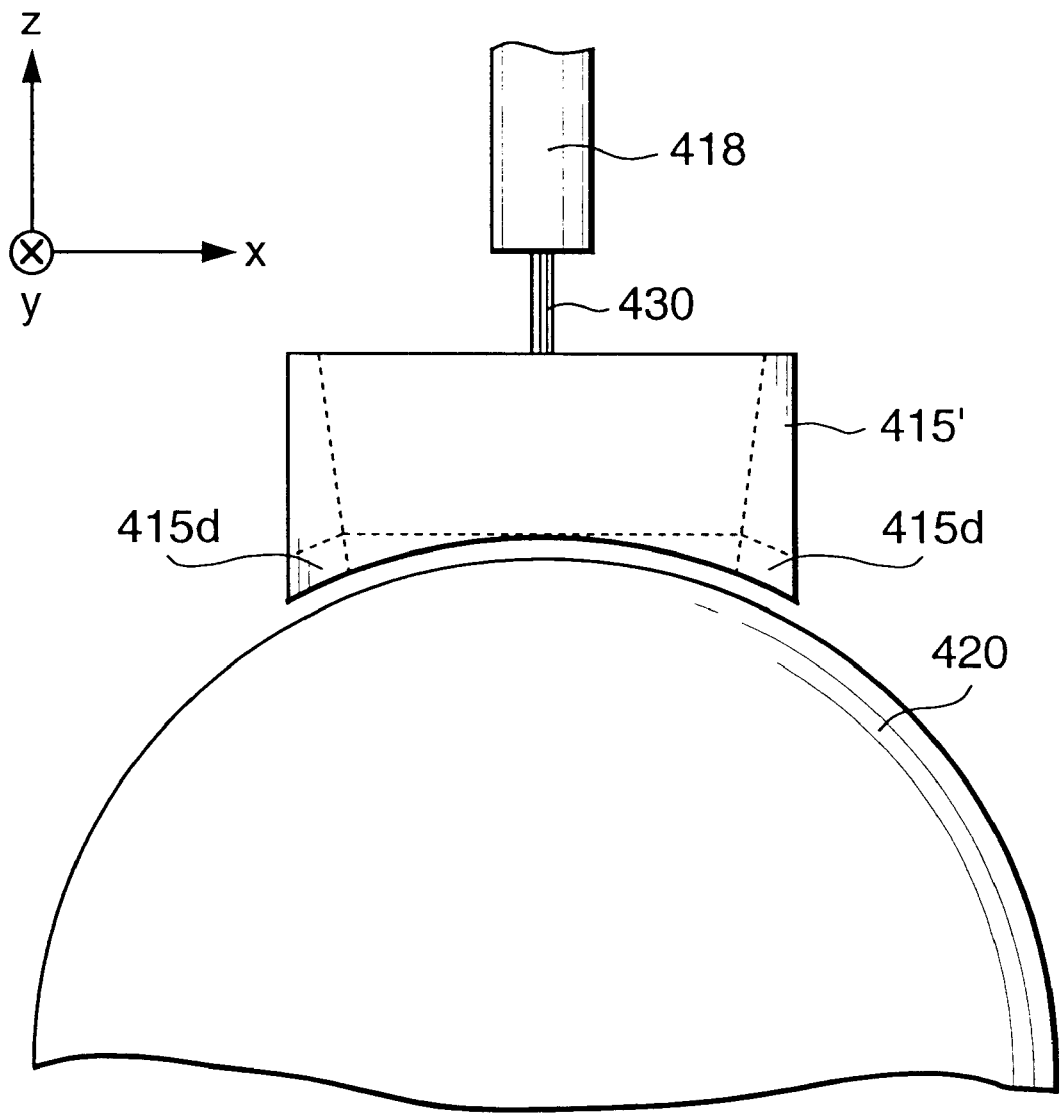
FIGS. 9 to 11 are views showing an outline of the arrangement of a guide unit of a separating apparatus according to the second arrangement.
Figure 10:
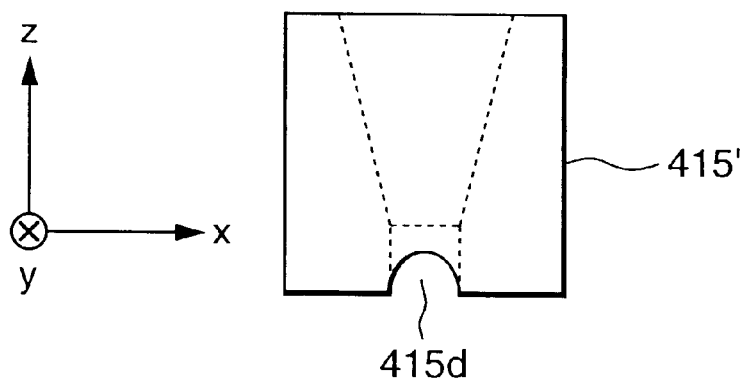
Figure 11:
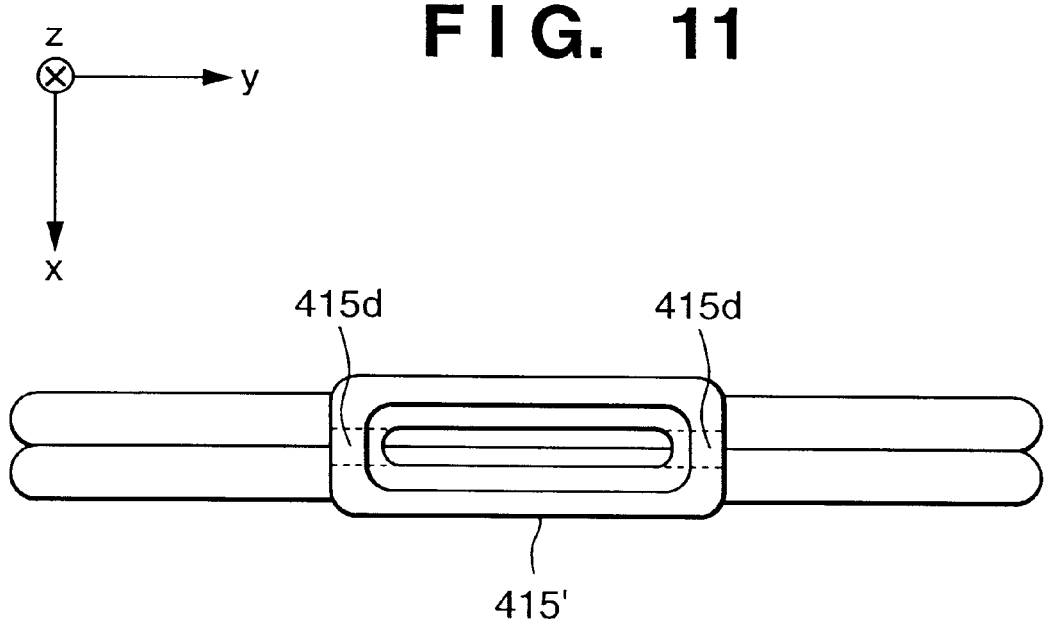

This separating apparatus is obtained by improving the structure of the guide unit of the separating apparatus according to the first arrangement. The rest of the arrangement is the same as the first arrangement. FIGS. 9 to 11 are views showing an outline of the structure of a guide unit of the separating apparatus according to the second arrangement.

A guide unit 415' according to this arrangement has a discharge groove 415d in the surface opposing a bonded substrate stack 420. This discharge groove 415d efficiently discharges the jet medium (e.g., a liquid such as water) overflowing from the bonded substrate stack 420 sideways.

[Third arrangement of separating apparatus]

In a separating apparatus according to this arrangement, a guide unit and substrate holders are integrated to obviate the need for alignment of a bonded substrate stack and the guide unit.

Figure 12:
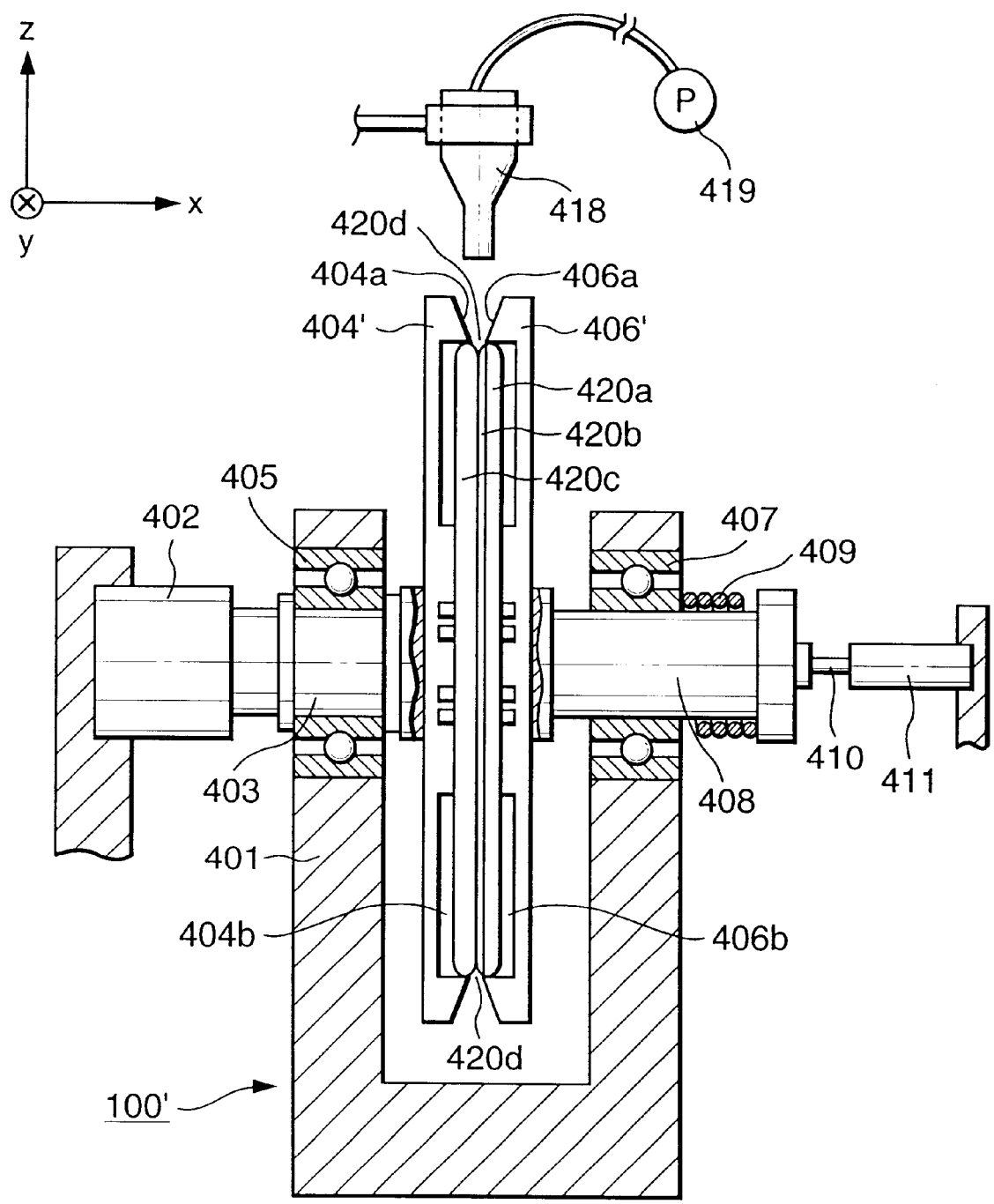
FIG. 12 is a sectional view showing an outline of the arrangement of a separating apparatus according to the third arrangement.

FIG. 12 is a sectional view showing an outline of the arrangement of the separating apparatus according to the third arrangement. The same reference numerals as in the separating apparatus 100 according to the first arrangement denote the same pats in the third arrangement, and a detailed description thereof will be omitted.

This separating apparatus 100' includes a jet guide unit in the annular rims of disk-like substrate holders 404' and 406'. That is, the substrate holders 404' and 406' have guide surfaces 404a and 406a, respectively, which expose a V-groove 420d formed in the circumferential surface of a bonded substrate stack 420 when the bonded substrate stack 420 is clamped as shown in FIG. 12. A gap defined by these guide surfaces 404a and 406a functions in the same manner as the hole 415c described above, i.e., thrusts the jet ejected from a jet nozzle 418 into the V-groove 420d of the bonded substrate stack 420. The guide surfaces 404a and 406a are formed throughout the entire circumferences of the disk like substrate holders 404' and 406'. The guide surfaces 404a and 406a also function as a discharge opening for discharging the thrust jet medium.

Annular grooves 404b and 406b are formed in those surfaces of the substrate holders 404' and 406', respectively, which face the bonded substrate stack 420. When separating forces act from the inside to the outside of the bonded substrate stack 420 due to a thrust of the jet, the annular grooves 404b and 406b allow the bonded substrate stack 420 to open (warp) into two substrates in the direction of the section and the jet medium to be efficiently discharged.

To set the bonded substrate stack 420 in the separating apparatus 100', the bonded substrate stack 420 is pushed against the suction surface of the substrate holder 404' by a conveyor robot or the like with the two substrate holders 404' and 406' separated from each other, i.e., with a piston rod 410 of an air cylinder 411 accommodated, and a vacuum chuck of the substrate holder 404' is operated. Then, the piston rod 410 is pushed by the air cylinder 411 to push the suction surface of the substrate holder 406' against the bonded substrate stack 420. In this state a vacuum chuck of the substrate holder 406' is operated. Subsequently, the piston rod 410 is accommodated in the air cylinder 411 to start the separating process.

The separating process is performed by ejecting a jet from the jet nozzle 418 while the bonded substrate stack 420 is rotated by a motor 402. When the separating process is complete, as in the case of the separating apparatus 100 according to the first arrangement, a substrate 420a is moved in an x-axis direction by the action of a compression spring 409 and separated from a substrate 420c.

To remove the completely separated substrates, the two substrates are held by suction by, e.g., conveyor robots, and the suction by the vacuum chucks of the substrate holders 404' and 406' is released.

In this separating apparatus 100', only by setting the bonded substrate stack 420 between the substrate holders 404' and 406', the position at which the jet ejected from the jet nozzle 418 thrusts into the bonded substrate stack 420 is aligned with the separation region (porous layer). This eliminates the need for mechanisms (e.g., the motor 417 and its control mechanism in the first arrangement) for adjusting the position of the guide unit. Accordingly, the arrangement of the apparatus can be simplified.

Methods of fabricating an SOI substrate will be described below with reference to FIGS. 1A to 1E as applications of the above separating apparatuses.

[First application]

As a single-crystal Si substrate 11, a p- or n-type (100) single-crystal Si substrate having a thickness of 625 [μm], a diameter of 5 [inch], and a specific resistance of 0.01 [Ω·cm] was prepared. This single-crystal Si substrate 11 was dipped into an HF solution and anodized to form a porous layer 12 having a thickness of 10 [μm] and a porosity of 15 [%] (FIG. 1A). The anodizing conditions were as follows.

Current density: 7 [mA/cm$^2$]

Anodizing solution: HF:H$_2$O:C$_2$H$_5$OH=1:1:1

Processing time: 11 [min]

The resultant substrate was heated to 400 [°C.] in an oxygen ambient and oxidized for one hour. Consequently, the inner walls of pores of the porous Si layer 12 were covered with a thermal oxide film. Subsequently, 0.3-μm thick single-crystal Si layer 13 was epitaxially grown on the porous Si layer 12 by CVD (FIG. 1B). The conditions of epitaxial growth were as follows.

Source gas: SiH$_4$

Carrier gas: H$_2$

Temperature: 850 [°C.]

Pressure: 1×10$^{-2}$ [torr]

Growth rate: 3.3 [nm/sec]

In addition, a 500-nm thick SiO$_2$ layer 15 was formed on this single-crystal Si layer (epitaxial Si layer) 13. A single-crystal Si substrate 14 on which a 500-nm thick SiO$_2$ layer 15 was formed was separately prepared, and the two SiO$_2$ layers were brought into contact at room temperature. Thereafter, a heat treatment was performed at a temperature of 700 [°C.] for two hours to bond the two substrates (FIG. 1C).

The resultant bonded substrate stack was set in the separating apparatus 100' according to the third arrangement described above, and the separating process was performed by the apparatus (FIG. 1D). In this process, pure water was used as a jet medium, the diameter of the jet was set at 0.2 [mm], and the pressure of ejected water was set at 2,500 [Kgf/cm$^2$]. Also, to check the function of the separating apparatus 100', the separating process was performed while the position of the jet nozzle was intentionally slightly shifted from the position immediately above the bonding interface. The bonded substrate stack was separated when rotated substantially once, and the two substrates were driven away from each other by the action of the compression spring. The separated substrates had none of damages, cracks, and defects.

The two separated substrates were removed from the separating apparatus 100', and the porous Si layer on the surface was selectively etched with an HF/HNO$_3$/CH$_3$COOH-based etching solution. Since the etching rate of single-crystal Si is very low, the etching amount of the underlying single-crystal Si substrate of the porous Si layer is practically negligible. It was possible by this etching process to form an SOI substrate having a single-crystal Si layer 13 about 0.2 μm thick on the SiO$_2$ film 15 (FIG. 1E).

No defects were found on the surface of the complete SOI substrate, i.e., the surface of the single-crystal Si layer 15. Also, when the section of the single-crystal Si layer 15 was observed with a transmission electron microscope, no crystal defects were found and high crystallinity was maintained.

Note that a high-quality SOI substrate could also be formed even when no $SiO_2$ film was formed on the surface of the single-crystal Si layer (epitaxial layer) 13 after the step shown in FIG. 1B.

The substrate (single-crystal Si substrate 11) on which the porous Si layer was formed could be reused as the first substrate by removing the porous Si layer from the surface and planarizing the surface. To reuse the substrate from which the porous Si layer was removed as the first substrate as described above, it is preferable to chamfer the periphery.

[Second application]

In this application, the separating apparatus 100 according to the first or second arrangement was used in place of the separating apparatus 100' according to the third arrangement in the separating process of the first application. In this application, pure water was used as a jet medium, the diameter of the jet was set at 1.0 [mm], and the pressure of ejected water was set at 850 [$Kgf/cm^2$]. Also, the width of the V-groove of the bonded substrate was set at 0.625 [mm], and the width of the discharge opening of the guide unit was set at 0.625 [mm].

Although a jet having a diameter larger than the width of the V-groove of the bonded substrate stack was used as described above, the jet efficiently thrust into the V-groove of the bonded substrate because the width of the jet was restricted by the guide unit. Consequently, the bonded substrate stack was rapidly separated.

Additionally, the complete SOI substrate was as good as the SOI substrate fabricated in the first application.

Separating apparatuses suited to fabricate an SOI substrate have been described as preferred embodiments of the present invention. However, the separating apparatuses according to the present invention can also be used to separate or cut another member.

The member to be separated preferably has a fragile separation region such as a porous layer.

The present invention can suppress damages to the separated surfaces and reduce contamination to the apparatus or the sample.

Also, the present invention can fabricate high-quality substrates.

Although the characteristic technical ideas have been described by using specific embodiments, the present invention is not limited to the contents described in these embodiments. That is, the present invention can be modified without departing from the scope of the technical ideas described in the appended claims.

What is claimed is:

1. A separating apparatus for separating a sample having an internal fragile structure, comprising:

a jet unit for ejecting a jet of liquid or gas; and a guide unit for concentrating the jet of liquid or gas ejected from said jet unit into said fragile structure of said sample, whereby said sample is separated at said fragile structure, wherein said fragile structure of said sample to be separated forms a substantially flat plane, and a support mechanism supports said sample to send the jet of liquid or gas ejected through said guide unit in a direction of the plane of said fragile structure, said support mechanism including a rotating mechanism for rotating said sample around a shaft disposed in a direction substantially perpendicular to the plane of said fragile structure, and supports said sample while rotating said sample.

2. A separating apparatus for separating a sample having an internal fragile structure, comprising:

a jet unit for ejecting a jet of liquid or gas; and a guide unit for concentrating the jet of liquid or gas ejected from said jet unit into said fragile structure of said sample, wherein said sample is separated at said fragile structure and said guide unit is disposed in a support unit for supporting said sample.

3. The apparatus according to claim 2, wherein said support unit comprises two holding units for holding said sample by clamping said sample from both sides, and said guide unit is formed by a gap between opposing portions of said two holding units.

4. The apparatus according to claim 3, wherein inclined surfaces are formed in the opposing portions of said two holding units, and said opposing inclined surfaces concentrate the jet of liquid or gas ejected from said jet unit into said fragile structure of said sample by decreasing the width of the jet to a predetermined width.

5. The apparatus according to claim 4, wherein said sample to be separated has a disk shape, the opposing portions of said two holding units form annular rims, and said sample is held inside the rims.

6. The apparatus according to claim 3, wherein said holding units hold said sample to warp said sample by a pressure of liquid or gas.

7. The apparatus according to claim 3, wherein said two holding units are holding units for holding a substrate as a sample to be separated.

8. A liquid or gas guide apparatus to be applied to a method of separating a sample having an internal fragile structure by ejecting a jet of liquid or gas, characterized by comprising:

a guide unit for concentrating the jet of liquid or gas ejected from a jet unit into said fragile structure of said sample;

a connecting unit for connecting with a sample separating apparatus comprising said jet unit and a holding mechanism for holding said sample; and an adjusting mechanism for adjusting a positional relationship between said guide unit and said sample.

9. A separating apparatus for separating a plate-shaped sample having an internal fragile structure, comprising:

a support mechanism for supporting said plate-shaped sample; and a jet unit for ejecting a jet of liquid or gas, wherein said support mechanism has a guide unit for concentrating the jet of liquid or gas ejected from said jet unit into a side of said plate-shaped sample and supports said plate-shaped sample to warp a separated periphery of said plate-shaped sample by a pressure of the liquid or gas injected into said plate-shaped sample.

10. A separating apparatus for separating a sample having an internal fragile structure, comprising:

a support member for supporting said sample by clamping said sample from both sides; and a fluid guiding portion for guiding fluid so that a pressure of the fluid is applied to a groove formed in a circumferential surface of said sample.

11. The apparatus according to claim 10, wherein said fluid guiding portion is located at a circumference of said support member.

12. The apparatus according to claim 10, wherein said support member has a space which allows said sample to warp during a separating process.

* * * * *

UNITED STATES PATENT AND TRADEMARK OFFICE
CERTIFICATE OF CORRECTION

PATENT NO. : 6,427,747 B1  
DATED : August 6, 2002  
INVENTOR(S) : Kazuaki Omi et al.

It is certified that error appears in the above-identified patent and that said Letters Patent is hereby corrected as shown below:

Column 3,  
Line 40, "holding substrate" should read -- holding a substrate --

Column 4,  
Line 25, "decreasing he width" should read -- decreasing the width --

Column 5,  
Line 60, "on the surface" should read -- 15 on the surface --

Column 8,  
Line 52, "arrows a and a'." should read -- arrows a and a'. --

Column 9,  
Line 9, "and 10 the insulating" should read -- and the insulating --

Column 12,  
Line 21, "Subsequently, 0.3-μm" should read -- Subsequently, a 0.3-μm --

Signed and Sealed this

Twenty-eighth Day of January, 2003

JAMES E. ROGAN  
*Director of the United States Patent and Trademark Office*